(12) United States Patent
He et al.

(10) Patent No.: US 10,816,592 B2
(45) Date of Patent: Oct. 27, 2020

(54) SAMPLING CLOCK TESTING CIRCUIT AND SAMPLING CLOCK TESTING METHOD

(71) Applicant: Realtek Semiconductor Corporation, Hsinchu (TW)

(72) Inventors: Tsung-Yeh He, Kaohsiung (TW); Hsu-Jung Tung, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 453 days.

(21) Appl. No.: 15/857,633

(22) Filed: Dec. 29, 2017

(65) Prior Publication Data

US 2018/0203060 A1    Jul. 19, 2018

(30) Foreign Application Priority Data

Jan. 17, 2017   (TW) .............................. 106101546 A

(51) Int. Cl.
*G01R 31/28*   (2006.01)
*G06F 1/04*    (2006.01)
*G01R 25/00*   (2006.01)
*G09G 5/00*    (2006.01)

(52) U.S. Cl.
CPC ......... *G01R 31/282* (2013.01); *G01R 25/005* (2013.01); *G06F 1/04* (2013.01); *G09G 5/008* (2013.01)

(58) Field of Classification Search
CPC ........ G06N 3/00; G09G 1/00; G09G 2230/00; G01R 1/00
See application file for complete search history.

(56) References Cited

U.S. PATENT DOCUMENTS

| | | | | |
|---|---|---|---|---|
| 2005/0242849 | A1* | 11/2005 | Muramatsu | H03K 23/56 327/151 |
| 2007/0229692 | A1* | 10/2007 | Iseki | G09G 3/3283 348/324 |
| 2010/0128831 | A1* | 5/2010 | Lee | G06F 11/1604 375/360 |

(Continued)

FOREIGN PATENT DOCUMENTS

| | | |
|---|---|---|
| TW | 200822564 A | 5/2008 |
| TW | 201206172 A | 2/2012 |
| TW | 201510970 A | 3/2015 |

*Primary Examiner* — Jermele M Hollington
*Assistant Examiner* — Temilade S Rhodes-Vivour
(74) *Attorney, Agent, or Firm* — CKC & Partners Co., LLC

(57) ABSTRACT

A sampling clock testing circuit includes a clock circuit, a processing circuit and a phase determining circuit. The clock circuit generates a clock signal and switches phases of the clock signal according to a horizontal synchronous signal. The processing circuit samples a data signal according to the clock signal with the phases to generate pixel data groups each of which is corresponding to one phase. The phase determining circuit generates calculated values according to the pixel data groups, in which each phase is corresponding to one calculated value. The phase determining circuit selects a specific calculated value from the calculated values according to a predetermined condition, and determines a specific phase corresponding to the specific calculated value. The processing circuit samples a subsequent data signal according to the clock signal switched to the specific phase to generate subsequent pixel data.

18 Claims, 5 Drawing Sheets

(56) References Cited

U.S. PATENT DOCUMENTS

| | | | | |
|---|---|---|---|---|
| 2010/0148832 A1* | 6/2010 | Oshima | ............... | H03L 7/091 |
| | | | | 327/159 |
| 2013/0207702 A1* | 8/2013 | Bulzacchelli | ........ | H03K 5/1565 |
| | | | | 327/164 |
| 2014/0226771 A1* | 8/2014 | Arima | ................ | H03L 7/091 |
| | | | | 375/373 |

* cited by examiner

US 10,816,592 B2

1

SAMPLING CLOCK TESTING CIRCUIT AND SAMPLING CLOCK TESTING METHOD

RELATED APPLICATIONS

This application claims priority to Taiwan Application Serial Number 106101546, filed Jan. 17, 2017, which is herein incorporated by reference.

BACKGROUND

Technical Field

The present disclosure relates to a sampling technology. More particularly, the present disclosure relates to a sampling clock testing circuit and a sampling clock testing method.

Description of Related Art

In an analog-to-digital image process, a clock signal is an important factor that affects quality of a sampled digital signal. As shown in FIG. 5, if clock signal with different phases CLK1 and CLK2 are used to sample analog data signal Data, then quality of a digital signal sampled by the clock signal CLK1 is better. During an operation of sampling an analog image signal, in order to test out the best phase of the clock signal, the clock signal with a single fixed phase is generally used to sample an entire frame of the analog data signal, so as to test the quality of a digital signal sampled by the clock signal with the single fixed phase. After the entire frame of the analog data signal has been sampled by the clock signal with a phase to be tested, the clock signal is then switched to a next phase to be tested to sample a next entire frame. Therefore, if the number of the phases to be tested is large, the number of frames used for test is also increased, and thus the aforementioned test method is not only time consuming, but also inefficient.

SUMMARY

An aspect of the present disclosure is to provide a sampling clock testing circuit that includes a clock circuit, a processing circuit and a phase determining circuit. The processing circuit is coupled to the clock circuit, and the phase determining circuit is coupled to the clock circuit and the processing circuit. The clock circuit is configured to generate a clock signal and to switch plural phases of the clock signal according to a horizontal synchronous signal. The processing circuit is configured to sample a data signal according to the clock signal with the phases to generate pixel data groups, in which each of the pixel data groups is corresponding to one of the phases. The phase determining circuit is configured to generate calculated values according to the pixel data groups, in which each of the phases is corresponding to one of the calculated values. The phase determining circuit is further configured to select a specific calculated value from the calculated values according to a predetermined condition, and to determine a specific phase corresponding to the specific calculated value. The processing circuit is further configured to sample a subsequent data signal according to the clock signal that is switched to the specific phase, so as to generate subsequent pixel data.

Another aspect of the present disclosure is to provide a sampling clock testing method that includes steps as follows. By a clock circuit, a clock signal is generated and phases of the clock signal are switched according to a horizontal synchronous signal. By a processing circuit, a data signal is sampled according to the clock signal with the phases to generate pixel data groups, in which each of the

2 pixel data groups is corresponding to one of the phases. By a phase determining circuit, calculated values are generated according to the pixel data groups, in which each of the phases is corresponding to one of the calculated values. By the phase determining circuit, a specific calculated value is selected from the calculated values according to a predetermined condition, and a specific phase corresponding to the specific calculated value is determined. By the processing circuit, a subsequent data signal is sampled according to the clock signal that is switched to the specific phase, so as to generate subsequent pixel data.

In sum, the sampling clock testing circuit and the sampling clock testing method in the present disclosure can switch the phase of the clock signal according to the horizontal synchronous signal during a process of sampling data signal in a frame, rather than switching the phase of the clock signal after a whole frame is sampled. Moreover, the sampling clock testing circuit and the sampling clock testing method in the present disclosure can generate a corresponding calculated value to select the clock signal with the best phase. Therefore, the best phase of the clock signal for sampling can be rapidly selected from one or more phases of the clock signal in the present disclosure.

DETAILED DESCRIPTION

In the following description and claims, the terms "coupled" and "connected," along with their derivatives, may be used. In particular embodiments, "connected" and "coupled" may be used to indicate that two or more elements are in direct physical or electrical contact with each other, or may also mean that two or more elements may be in indirectly electrical contact with each other. The terms "coupled" and "connected" may still be used to indicate that two or more elements cooperate or interact with each other.

Figure 1:
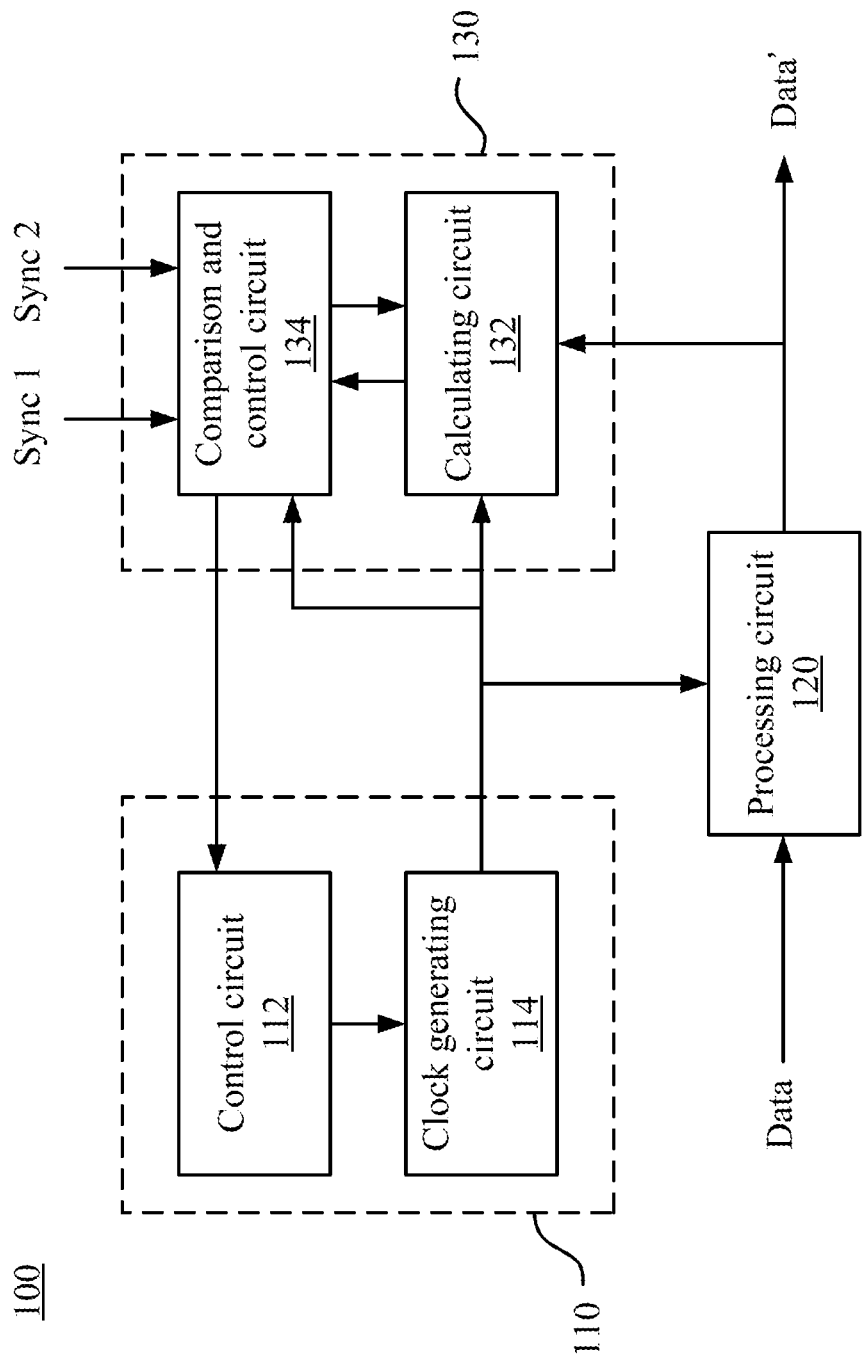
FIG. 1 is a schematic diagram of a sampling clock testing circuit in accordance with an embodiment of the present disclosure.
Figure 3:
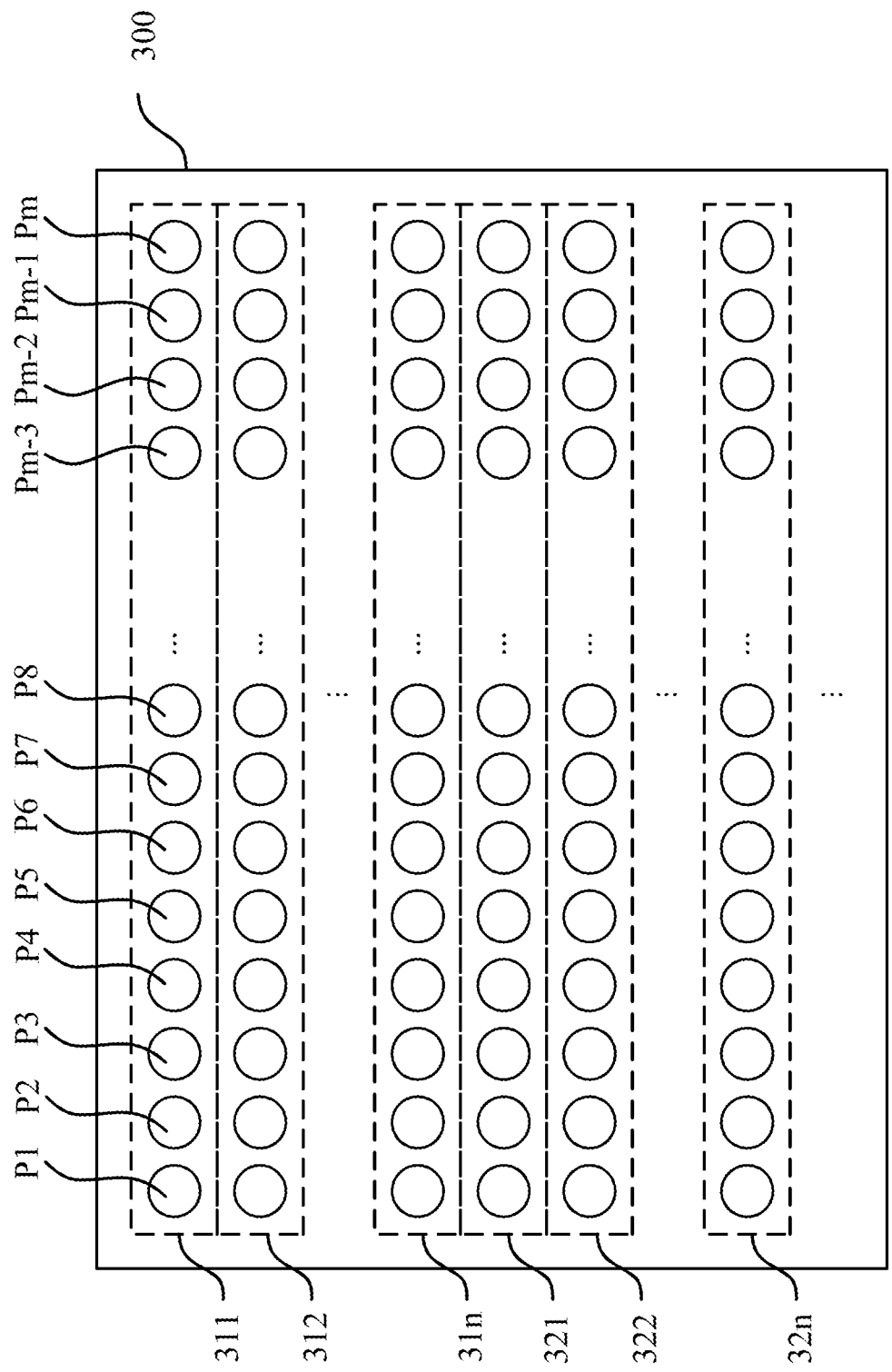
FIG. 3 is a schematic diagram of a frame in accordance with an embodiment of the present disclosure.

Reference is made to FIGS. 1 and 3. A sampling clock testing circuit 100 includes a clock circuit 110, a processing circuit 120 and a phase determining circuit 130. The processing circuit 120 is coupled to the clock circuit 110, and the phase determining circuit 130 is coupled to the clock circuit 110 and the processing circuit 120. Different cycles of a vertical synchronous signal Sync 2 indicate different frames in a data signal Data of an analog image, and different cycles of a horizontal synchronous signal Sync 1 indicate different rows in a frame.

The clock circuit 110 is configured to generate a clock signal and to switch n phases (n>1) of the clock signal according to the horizontal synchronous signal Sync 1, and to generate clock signal with different phases CLK1-CLKn (not shown). The clock signal with different phases CLK1-

CLKn may be provided to the processing circuit 120 and the phase determining circuit 130. The processing circuit 120 samples a data signal Data of an analog image according to the clock signal with different phases CLK1-CLKn, so as to generate pixel data groups. In an embodiment, a first frame 300 shown in FIG. 3 includes pixel data groups 311-31$n$ and 321-32$n$.

As shown in FIGS. 1 and 3, the phase determining circuit 130 controls the clock circuit 110 to switch the n phases of the clock signal according to the read horizontal synchronous signal Sync 1. In the present embodiment, every time after reading the horizontal synchronous signal Sync 1, the phase determining circuit 130 controls the clock circuit 110 to switch the clock signal to a next phase. The processing circuit 120 sequentially samples the data signal Data according to the clock signal with different phases CLK1-CLKn, so as to generate different pixel data groups 311-31$n$ and 321-32$n$ of the first frame 300, in which each of the pixel data groups 311-31$n$ and 321-32$n$ is corresponding to a phase. Specifically, the processing circuit 120 may cyclically use the clock signal with different phases CLK1-CLKn to sample the data signal Data, so as to sequentially generate the pixel data groups 311-31$n$ and 321-32$n$, (i.e., first sample the data signal Data according to the clock signal with the first phase CLK1 to generate the pixel data group 311, then sample the data signal Data according to the clock signal with the second phase CLK2 to generate the pixel data group 312, . . . , and thereafter sample the data signal Data according to the clock signal with the nth phase CLKn to generate the pixel data group 31$n$; and then from the first phase again, sample the data signal Data according to the clock signal with the first phase CLK1 to generate the pixel data group 321, then sample the data signal Data according to the clock signal with the second phase CLK2 to generate the pixel data group 322, . . . , and thereafter sample the data signal Data according to the clock signal with nth phase CLKn to generate the pixel data group 32$n$). As shown in FIG. 3, the processing circuit 120 continuously samples the data signal Data, and the generated pixel data groups 311-31$n$ and 321-32$n$ are sequentially displayed on pixels of adjacent rows in a display.

In the present embodiment, each of the pixel data groups 311-31$n$ and 321-32$n$ includes a row of pixel data in the first frame 300, and the row of pixel data is used to be displayed on a row of pixels in the display.

The phase determining circuit 130 is configured to generate calculated values S1-Sn (not shown) according to the pixel data groups 311-31$n$ and 321-32$n$ that display the sampled data signal, in which each of the phases of the clock signal with different phases CLK1-CLKn is corresponding to a calculated value in the calculated value S1-Sn. The calculated values S1-Sn respectively indicate quality of a digital signal (i.e., pixel data) sampled according to the clock signal with different phases CLK1-CLKn. For example, the pixel data groups 311 and 321 are generated by sampling according to the clock signal with the first phase CLK1, and then the phase determining circuit 130 generates the calculated value S1 according to the pixel data groups 311 and 321 to indicate quality of a digital signal (i.e., pixel data) sampled according to the clock signal with the first phase CLK1, and therefore S1 is corresponding to the clock signal with the first phase CLK1. Similarly, the calculated value S2 of the pixel data groups 312 and 322 is corresponding to the clock signal with the second phase CLK2, . . . , and Sn is corresponding to the clock signal with the nth phase CLKn.

In an embodiment, the phase determining circuit 130 includes a calculating circuit 132 and a comparison and control circuit 134. The calculating circuit 132 is coupled to the clock circuit 110, and the comparison and control circuit 134 is coupled to the clock circuit 110 and the calculating circuit 132, and is configured to control the clock circuit 110 to switch the n phases of the clock signal according to the read horizontal synchronous signal Sync 1. The calculated values S1-Sn may be sums of differences of the pixel data (e.g., pixel values). The following description is made based on a situation where the pixel data are pixel values. However, the present disclosure is not limited thereto. As shown in FIG. 3, for an example using the pixel data group 311, the calculating circuit 132 is configured to calculate a difference between each of the pixel data (i.e., the pixel values P1-Pm) and its adjacent pixel value. In other words, plural pixel value differences of the pixel data group 311 calculated by the calculating circuit 132 are |P2-P1|, |P3-P2|, |P4-P3|, . . . , |Pm-Pm-1|. Because the processing circuit 120 generates the pixel data group 311 by sampling the data signal Data according to the clock signal with the first phase CLK1, the pixel value differences are corresponding to the clock signal with the first phase CLK1. Similarly, the pixel data group 321 is also generated according to the clock signal with the first phase CLK1, and thus plural pixel value differences of the pixel data group 321 are also corresponding to the clock signal with the first phase CLK1. Similarly, plural pixel value differences of the pixel data groups 312 and 322 are corresponding to the clock signal with the second phase CLK2, . . . , and plural pixel value differences of the pixel data groups 31$n$ and 32$n$ are corresponding to the clock signal with the nth phase CLKn.

The calculating circuit 132 respectively sums up the pixel value differences corresponding to the clock signal with different phases CLK1-CLKn, so as to generate the calculated values S1-Sn. For example, the calculating circuit 132 sums up the plural pixel value differences of the pixel data groups 311 and 321 corresponding to the clock signal with the first phase CLK1, so as to generate the calculated value S1. In an embodiment, the comparison and control circuit 134 may include a storage unit (e.g., register) to temporarily store the pixel value differences and the calculated values S1-Sn. In an embodiment, the comparison and control circuit 134 may include registers R1-Rn (not shown) that are configured to temporarily store the corresponding pixel value differences and the calculated values S1-Sn respectively according to the clock signal with different phases CLK1-CLKn. When the processing circuit 120 samples the data signal Data according to the clock signal with the first phase CLK1 and generates the pixel data group 311, the calculating circuit 132 may sum up the generated plural pixel value differences of the pixel data group 311, and store the sum in the register R1 of the comparison and control circuit 134. Then, when the processing circuit 120 samples the data signal Data according to the clock signal with the second phase CLK2 and generates the pixel data group 312, the calculating circuit 132 sums up the generated plural pixel value differences of the pixel data group 312, and store the sum in the register R2 of the comparison and control circuit 134. Similarly, when the processing circuit 120 samples the data signal Data according to the clock signal with the nth phase CLKn and generates pixel data group 31$n$, the calculating circuit 132 sums up the generated plural pixel value differences of the pixel data group 31$n$, and store the sum in the register Rn of the comparison and control circuit 134. Likewise, the calculating circuit 132 then sequentially sums up the generated pixel value differences of the pixel data groups 321-32$n$, and stores the sums in the registers R1-Rn respectively. Based on the above process, the calculating circuit 132 sums up the plural pixel value differences of the pixel data groups 311 and 321 corresponding to the clock signal with the first phase CLK1 and stores the sum in the register R1 to generate the calculated value S1, sums up the plural pixel value differences of the pixel data groups 312 and 322 corresponding to the clock signal with the second phase CLK2 and stores the sum in the register R2 to generate the calculated value S2, . . . , and so on. As described above, the calculated values S1-Sn respectively indicate qualities of digital signals (i.e., pixel data) sampled according to the clock signal with different phases CLK1-CLKn. The comparison and control circuit 134 of the phase determining circuit 130 is configured to compare the calculated values S1-Sn according to a predetermined condition, so as to select a specific calculated value from the calculated values S1-Sn, and to determine a specific phase corresponding to the specific calculated value. For example, the comparison and control circuit 134 may select a maximum one Sm (which indicates the best quality) of S1-Sn, and determines a specific phase corresponding to Sm, i.e., the mth phase. Therefore, a digital signal (i.e., pixel data) sampled according to the clock signal with the mth phase has the best quality. The processing circuit 120 is further configured to sample the subsequent data signal Data according to the clock signal with the specific phase, so as to generate subsequent pixel data Data' for displaying on the display.

Through the above embodiments, the sampling clock testing circuit 100 can switch the clock signal with different phases CLK1-CLKn according to the horizontal synchronous signal Sync 1, and sample the data signal Data according to the different phases during a process of sampling the data signal in a single frame (in a cycle of the vertical synchronous signal Sync 2). The sampling clock testing circuit 100 is different from the prior art that uses a clock signal with a phase to sample a whole frame, and then switches the phase of the clock signal. Therefore, the embodiments of the present disclosure can rapidly generate different pixel data groups 311-31n and 321-32n corresponding to the clock signal with different phases CLK1-CLKn, then rapidly calculate the calculated value S1-Sn corresponding to the different phases, and accordingly select the clock signal that is switched to the best phase.

In an embodiment, as shown in FIG. 1, the clock circuit 110 includes a control circuit 112 and a clock generating circuit 114. The control circuit 112 is coupled to the phase determining circuit 130, and the clock generating circuit 114 is coupled to the control circuit 112, the processing circuit 120 and the phase determining circuit 130. The control circuit 112 is configured to generate phase setting signals according to the horizontal synchronous signal Sync 1. The phase determining circuit 130 controls the control circuit 112 to generate the phase setting signals according to the read horizontal synchronous signal Sync 1. The clock generating circuit 114 (e.g., phase locked loops (PLL) clock generator) is configured to switch the different phases of the clock signal according to the phase setting signals.

Figure 2:
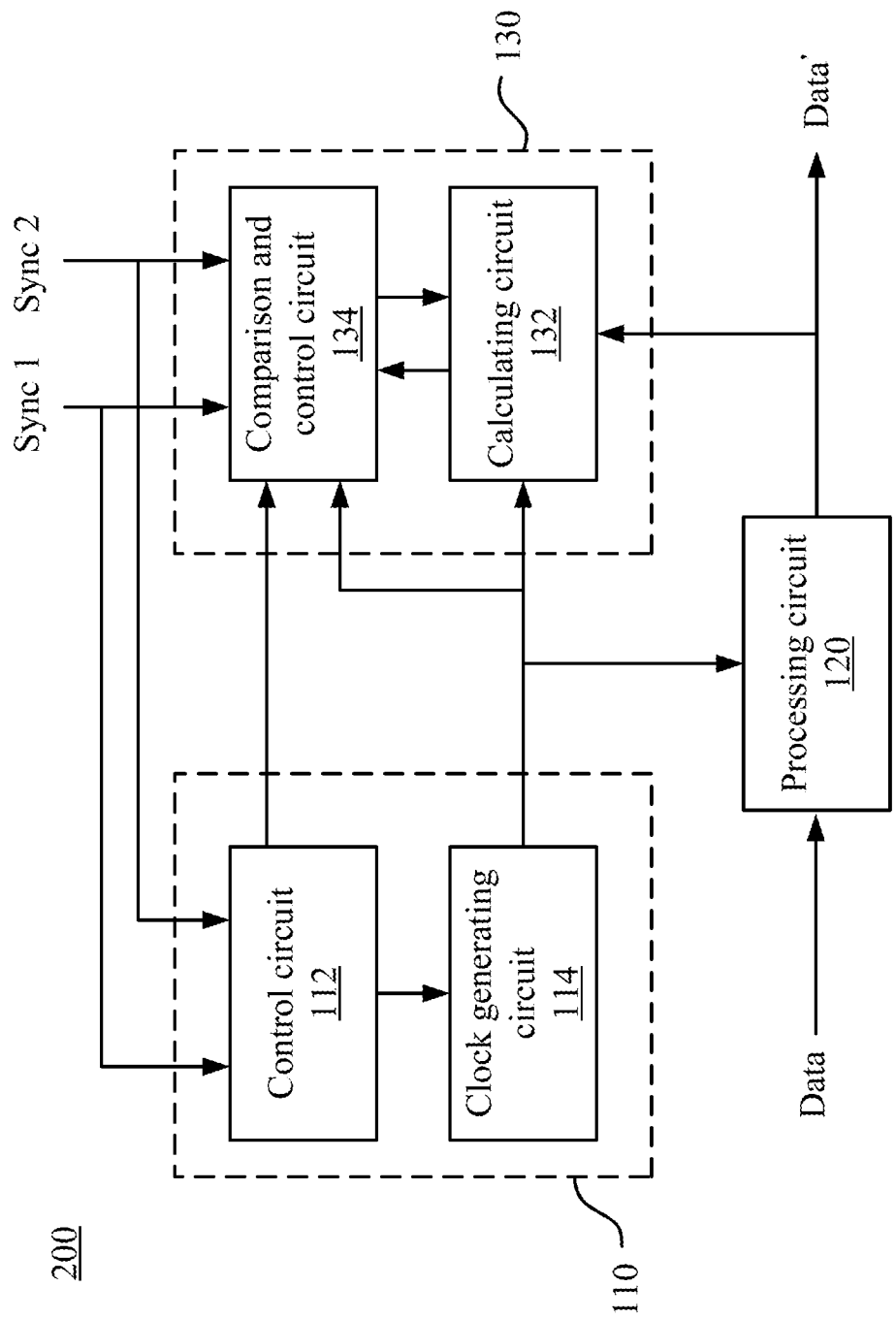
FIG. 2 is a schematic diagram of a sampling clock testing circuit in accordance with an embodiment of the present disclosure.

In another embodiment, as shown in FIG. 2, the processing circuit 120 can discontinuously sample the data signal Data to generate pixel data groups. In other words, the generated pixel data groups may not be adjacent to each other, and may also be in different frames. Specifically, because different cycles of the vertical synchronous signal Sync 2 indicate different frames, and different cycles of the horizontal synchronous signal Sync 1 indicate different rows in a frame, the control circuit 112 may generate the phase setting signals according to the horizontal synchronous signal Sync 1 and the vertical synchronous signal Sync 2, so as to determine a position of a pixel data group corresponding to each of the phases. Therefore, the processing circuit 120 may sample the data signal Data according to the clock signal with different phases CLK1-CLKn, so as to generate different pixel data groups that are not adjacent to each other or located in different frames, and the control circuit 112 may control the phase determining circuit 130 to correspondingly generate the calculated values S1-Sn, thereby further selecting the specific calculated value according to the predetermined condition.

Figure 4:
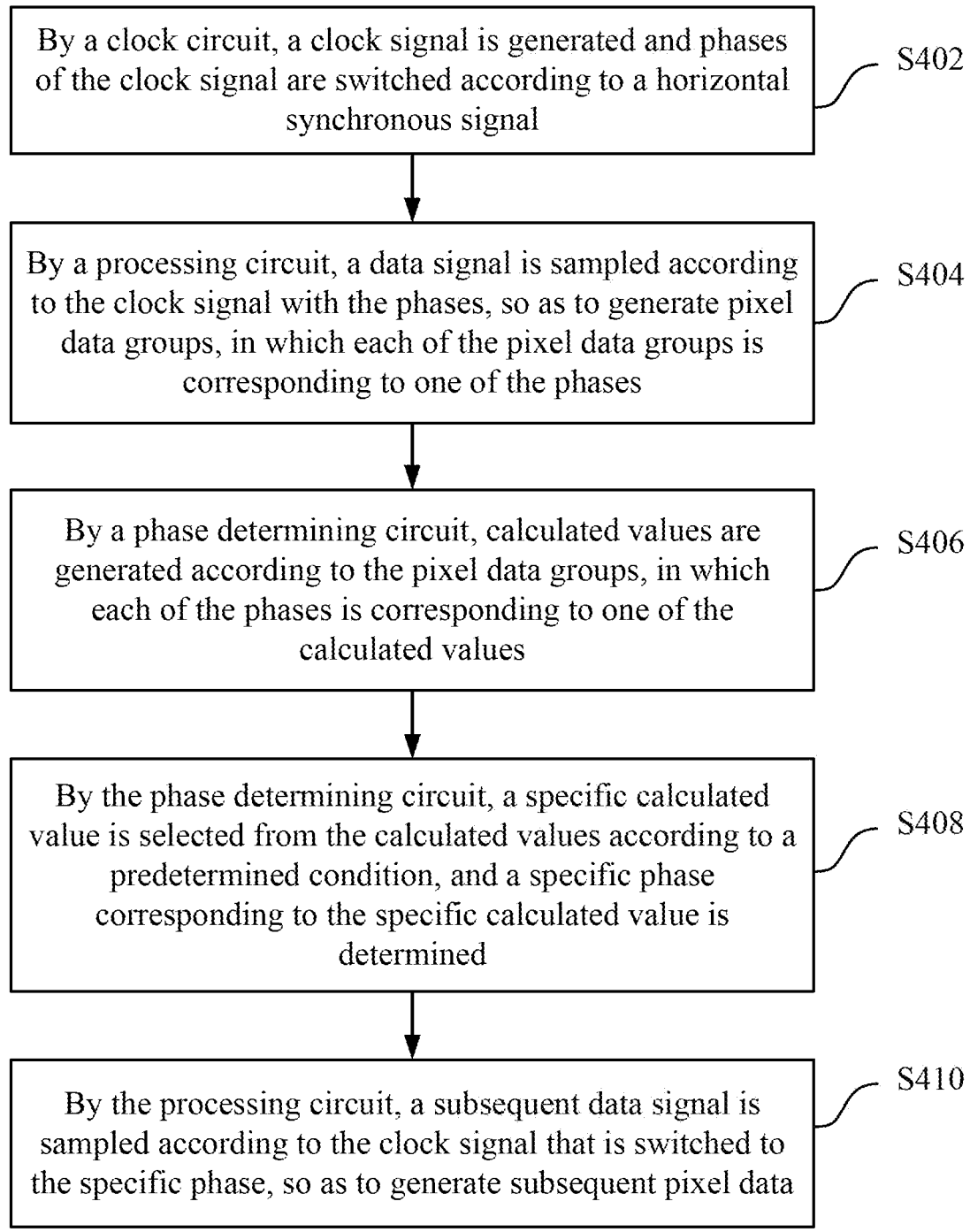
FIG. 4 is a flow chart illustrating a sampling clock testing method in accordance with an embodiment of the present disclosure.
Figure 5:
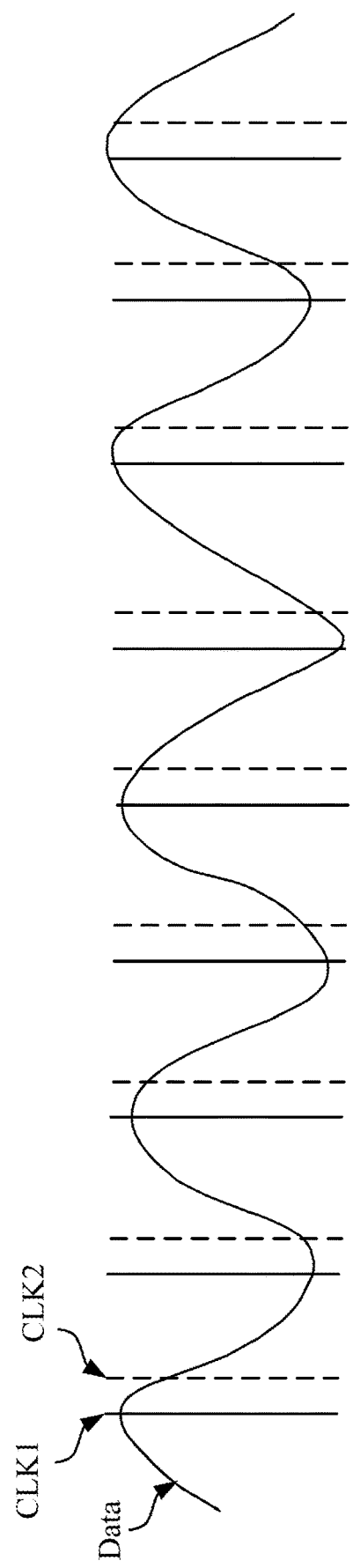
FIG. 5 is a schematic diagram of sampling a data signal according to a clock signal with different phases, in accordance with an embodiment of the present disclosure.

FIG. 4 is a flow chart illustrating a sampling clock testing method 400 in accordance with an embodiment of the present disclosure. The sampling clock testing method 400 includes steps S402-S410, and the sampling clock testing method 400 can be applied to the sampling clock testing circuits 100 and 200 as shown in FIGS. 1 and 2. However, those skilled in the art should understand that the aforementioned steps in the present embodiment are in an adjustable execution sequence according to the actual requirements except for the steps described in a special sequence, and even the steps or parts of the steps can be executed simultaneously.

In step S402, by a clock circuit 110, a clock signal is generated and phases of the clock signal are switched according to a horizontal synchronous signal Sync 1.

In step S404, by a processing circuit 120, a data signal Data is sampled according to the clock signal with the phases CLK1-CLKn, so as to generate pixel data groups 311-31n and 321-32n, in which each of the pixel data groups 311-31n and 321-32n is corresponding to one of the phases.

In step S406, by a phase determining circuit 130, calculated values S1-Sn are generated according to the pixel data groups 311-31n and 321-32n, in which each of the phases is corresponding to one of the calculated values S1-Sn.

In step S408, by the phase determining circuit 130, a specific calculated value (e.g., maximum) is selected from the calculated values S1-Sn according to a predetermined condition, and a specific phase corresponding to the specific calculated value is determined.

In step S410, by the processing circuit 120, a subsequent data signal Data is sampled according to the clock signal that is switched to the specific phase, so as to generate subsequent pixel data Data'.

In sum, the sampling clock testing circuits 100, 200 and the sampling clock testing method 400 in the present disclosure can switch the phase of the clock signal according to the horizontal synchronous signal Sync 1 during a process of sampling data signal in a frame, rather than switching the phase of the clock signal after a whole frame is sampled. Moreover, the sampling clock testing circuits 100, 200 and the sampling clock testing method 400 in the present disclosure can generate corresponding calculated value to select the clock signal with the best phase. Therefore, the best phase of the clock signal for sampling can be rapidly selected from one or more phases of the clock signal in the present disclosure.

What is claimed is:
1. A sampling clock testing circuit, comprising:
a clock circuit configured to generate a clock signal and to switch a plurality of phases of the clock signal according to a horizontal synchronous signal;
a processing circuit coupled to the clock circuit and configured to sample a data signal according to the clock signal with the phases, so as to generate a plurality of pixel data groups, wherein each of the pixel data groups is corresponding to one of the phases; and a phase determining circuit coupled to the clock circuit and the processing circuit, and configured to generate a plurality of calculated values according to the pixel data groups, wherein each of the phases is corresponding to one of the calculated values, wherein the phase determining circuit is further configured to select a specific calculated value from the calculated values according to a predetermined condition, and to determine a specific phase corresponding to the specific calculated value, and the processing circuit is further configured to sample a subsequent data signal according to the clock signal that is switched to the specific phase, so as to generate subsequent pixel data, wherein the phase determining circuit is further configured to generate a plurality of sums each of which is a sum of a plurality of pixel value differences corresponding to one of the phases according to the pixel data groups, and the sums are the calculated values corresponding to the phases.

2. The sampling clock testing circuit of claim 1, wherein the phase determining circuit comprises:
a calculating circuit coupled to the clock circuit and configured to generate the calculated values according to the pixel data groups; and
a comparison and control circuit coupled to the clock circuit and the calculating circuit, and configured to select the specific calculated value from the calculated values according to the predetermined condition.

3. The sampling clock testing circuit of claim 2, wherein the calculating circuit is further configured to calculate the plurality of pixel value differences corresponding to the each of the phases according to a plurality of pixel data of each of the pixel data groups, and respectively sum up the pixel value differences corresponding to the each of the phases, so as to generate the calculated values, and the comparison and control circuit is further configured to temporarily store the pixel value differences and the calculated values.

4. The sampling clock testing circuit of claim 1, wherein the clock circuit comprises:
a control circuit coupled to the phase determining circuit and configured to generate a plurality of phase setting signals; and
a clock generating circuit coupled to the control circuit, the processing circuit and the phase determining circuit, and configured to switch the phases of the clock signal according to the phase setting signals.

5. The sampling clock testing circuit of claim 4, wherein the clock generating circuit is a phase locked loop (PLL) clock generator.

6. The sampling clock testing circuit of claim 1, wherein the processing circuit is further configured to continuously sample the data signal to generate the pixel data groups.

7. The sampling clock testing circuit of claim 1, wherein the phase determining circuit is further configured to select a maximum value from the sums according to the predetermined condition, and the maximum value is the specific calculated value.

8. The sampling clock testing circuit of claim 1, wherein the processing circuit is further configured to sequentially sample the data signal according to a plurality of phase groups of the phases.

9. The sampling clock testing circuit of claim 1, wherein the clock circuit is further configured to switch the phases of the clock signal according to the horizontal synchronous signal and a vertical synchronous signal.

10. A sampling clock testing method, comprising:
by a clock circuit, generating a clock signal and switching a plurality of phases of the clock signal according to a horizontal synchronous signal;
by a processing circuit, sampling a data signal according to the clock signal with the phases, so as to generate a plurality of pixel data groups, wherein each of the pixel data groups is corresponding to one of the phases;
by a phase determining circuit, generating a plurality of calculated values according to the pixel data groups, wherein each of the phases is corresponding to one of the calculated values, further comprising by the phase determining circuit, generating a plurality of sums each of which is a sum of a plurality of pixel value differences corresponding to one of the phases according to the pixel data groups, and the sums are the calculated values corresponding to the phases;
by the phase determining circuit, selecting a specific calculated value from the calculated values according to a predetermined condition, and determining a specific phase corresponding to the specific calculated value; and
by the processing circuit, sampling a subsequent data signal according to the clock signal that is switched to the specific phase, so as to generate subsequent pixel data.

11. The sampling clock testing method of claim 10, wherein the phase determining circuit comprises a calculating circuit and a comparison and control circuit, and the sampling clock testing method further comprises:
by the calculating circuit, generating the calculated values according to the pixel data groups; and
by the comparison and control circuit, selecting the specific calculated value from the calculated values according to the predetermined condition.

12. The sampling clock testing method of claim 11, further comprising:
by the calculating circuit, calculating the plurality of pixel value differences corresponding to the each of the phases according to a plurality of pixel data of each of the pixel data groups, and summing up the pixel value differences corresponding to the each of the phases, so as to generate the calculated values; and
by the comparison and control circuit, temporarily storing the pixel value differences and the calculated values.

13. The sampling clock testing method of claim 10, wherein the clock circuit comprises a control circuit and a clock generating circuit, and the sampling clock testing method further comprises:
by the control circuit, generating a plurality of phase setting signals; and
by the clock generating circuit, switching the phases of the clock signal according to the phase setting signals.

14. The sampling clock testing method of claim 13, wherein the clock generating circuit is a phase locked loop (PLL) clock generator.

15. The sampling clock testing method of claim 10, further comprising:
by the processing circuit, continuously sampling the data signal to generate the pixel data groups.

16. The sampling clock testing method of claim 10, further comprising:
by the phase determining circuit, selecting a maximum value from the sums according to the predetermined condition, wherein the maximum value is the specific calculated value.

17. The sampling clock testing method of claim 10, further comprising:
- by the processing circuit, sequentially sampling the data signal according to a plurality of phase groups of the phases.

18. The sampling clock testing method of claim 10, further comprising:
- by the clock circuit, switching the phases of the clock signal according to the horizontal synchronous signal and a vertical synchronous signal.

* * * * *